US011362627B1

(12) United States Patent
Chu et al.

(10) Patent No.: US 11,362,627 B1
(45) Date of Patent: Jun. 14, 2022

(54) PROCESS TRACKING PULSE GENERATOR

(71) Applicant: Micron Technology, Inc., Boise, ID (US)

(72) Inventors: Wei Lu Chu, Pudong (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/348,559

(22) Filed: Jun. 15, 2021

(51) Int. Cl.
*H03F 3/20* (2006.01)
*H03F 3/21* (2006.01)
*H03K 19/20* (2006.01)
*H03K 3/037* (2006.01)

(52) U.S. Cl.
CPC .............. *H03F 3/211* (2013.01); *H03K 3/037* (2013.01); *H03K 19/20* (2013.01); *H03F 2200/105* (2013.01)

(58) Field of Classification Search
CPC combination set(s) only.
See application file for complete search history.

(56) References Cited

U.S. PATENT DOCUMENTS 10,784,917 B2 * 9/2020 Easwaran ............... H04L 67/00
11,057,022 B2 * 7/2021 Zamprogno ........... H03K 3/011

* cited by examiner

*Primary Examiner* — Long Nguyen
(74) *Attorney, Agent, or Firm* — Fletcher Yoder, P.C.

(57) ABSTRACT

Systems and devices are provided for tracking pullup current generated by power amplifiers regardless of variations in PVT conditions. An apparatus may include one or more power amplifiers that powers components of the apparatus, a tracking circuit, and a pulse generation circuit. The tracking circuit may include an amplifier. Further, the tracking circuit may include pullup current tracking circuitry that is coupled to the amplifier and generates a first current that tracks pullup current generated by the one or more power amplifiers. Furthermore, the pulse generation circuit may include pullup current generator circuitry that generates a second current that mirrors the first current. In addition, the pulse generation circuit may also include pulse generator circuitry that is coupled to the pullup current generator circuitry and that generates a pulse to control operation of the one or more power amplifiers based at least in part on the second current.

20 Claims, 5 Drawing Sheets

PROCESS TRACKING PULSE GENERATOR

BACKGROUND

The present disclosure relates generally to the field of power amplifiers and, more particularly, to techniques for tracking and controlling operation of pullup transistors providing charges in a semiconductor device.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices, such as semiconductor devices, memory chips, microprocessor chips, image chips, and the like, may include circuitry that performs various operations based on a provided voltage and current. In some instances, the current provided to the circuitry may drop due to higher current demand, chip layout, and other factors. This higher current demand may be met using direct connections to external power. However, when the external power path is enabled for too long, the provided current may overshoot a desired current and may result in unwanted electrical behavior.

BRIEF DESCRIPTION OF DRAWINGS

Various aspects of this disclosure may better be understood upon reading the following detailed description and upon reference to the drawings in which.

DETAILED DESCRIPTION

Figure 1:
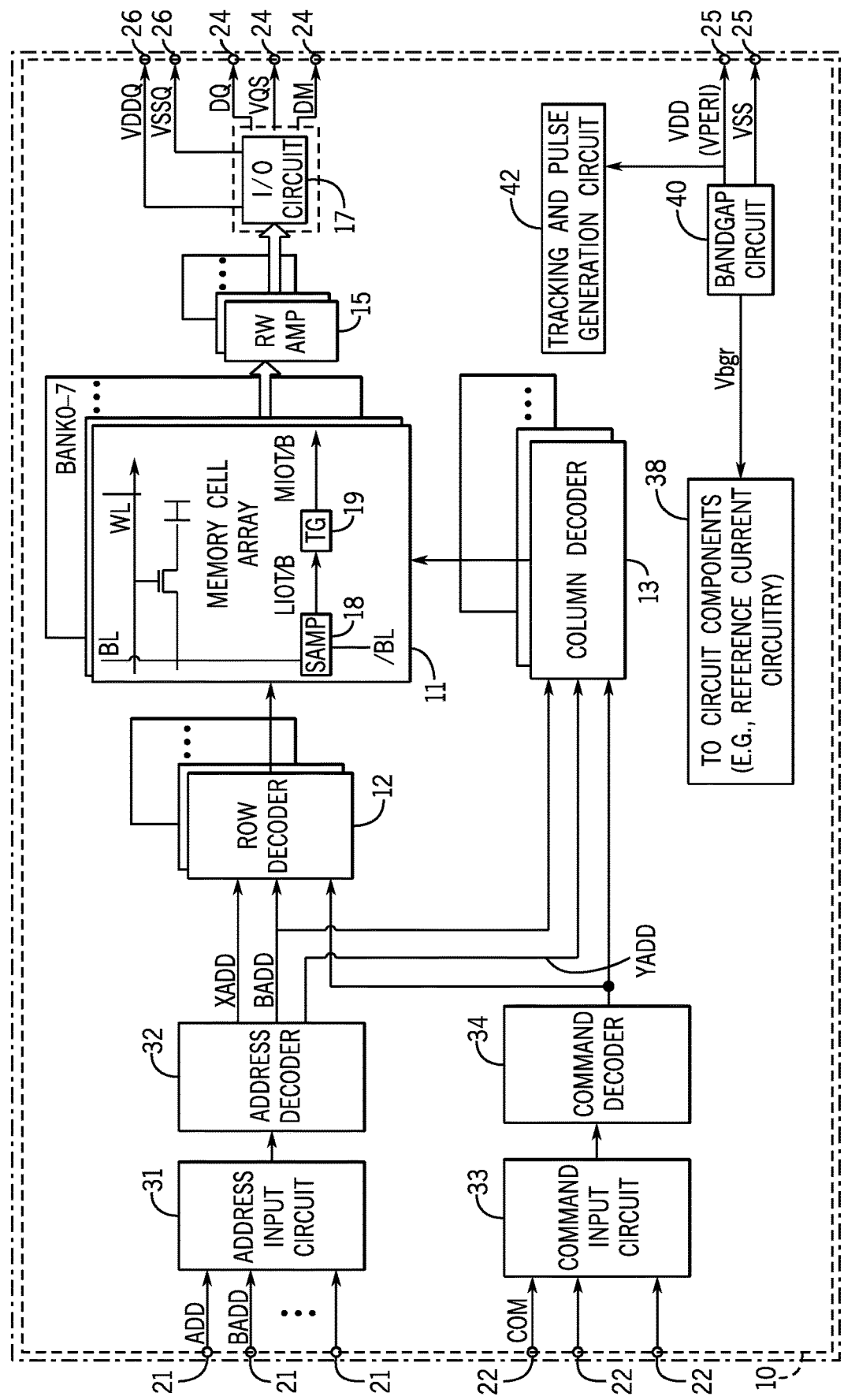
FIG. 1 is a simplified block diagram illustrating a semiconductor device that includes a tracking and pulse generation circuit, in accordance with an embodiment of the present disclosure.

One or more specific embodiments will be described below. To provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising,". "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to electronic devices that employ power amplifiers to power components of the electronic device and tracking circuitry to track pullup current generated by the power amplifiers. Generally, electronic devices may include one or more power amplifiers that generate an amplified output to drive circuitry and components within the electronic device. For example, semiconductor devices, such as high bandwidth memory (HBM) devices, may include many high-gain power amplifiers to provide high-magnitude operation current to the rest of the semiconductor device. Each power amplifier may include one or more P-channel metal-oxide semiconductor (PMOS) transistors that each generate a large current output to provide the high-magnitude operation current.

In some instances, for example, large current demands, chip layouts, and other factors, the power amplifiers may not be able to provide timely current for current drops. As a result, the provided current may drop below a target value. The time interval from the beginning of the dip until the power amplifier returns back to the desired level may result in undesired electrical behavior. Pullup circuitry may accommodate such current drops using external power. The pullup circuitry may include a PMOS transistor and may provide a short to external power to assist with current drops. The pullup circuitry may provide a dynamic pulse to enable the circuit to recover to the target current value.

However, current from the external power may differ from a target current value, for example, by exceeding the target current value. As such, if the pulse is enabled for a long period, the provided current may overshoot and exceed the target current value. Accordingly, the shorted external power is to be shut off before overshoot occurs to prevent unwanted electrical behavior in the memory device.

Regardless, the current magnitude may vary with variations in voltage applied to the PMOS, current flowing through the PMOS, environmental temperature, and the like. In other words, variations in process, voltage, temperature (PVT) conditions may cause variations in the current magnitude. It should be appreciated that while the present disclosure makes reference to a PMOS, any circuit components (e.g., N-channel metal-oxide semiconductor (NMOS)) that may be used in the pullup circuitry are contemplated in the present disclosure.

Accordingly, the present disclosure provides systems and techniques for tracking current across various PVT conditions, including corner cases, by using tracking circuitry that tracks the pullup current and by using pulse generation circuitry to control the pulse length of the short to the external power. Additional details with regard to pullup current across variations in PVT conditions will be described below with reference to FIGS. 1-5.

With this in mind, FIG. 1 illustrates a semiconductor device 10 that includes a tracking and pulse generation circuit 42, in accordance with an embodiment of the present disclosure. Although the following description of the semiconductor device 10 will be described in the context of a memory device, it should be noted that the embodiments described herein may be employed for any suitable electronic device. Indeed, the description of the memory device below is provided to explain certain aspects of the tracking and pulse generation circuit 42 of the present disclosure, and, as such, the embodiments described herein should not be limited to memory devices.

The semiconductor device 10 may be any suitable memory device, such as a low power double data rate type 4 (LPDDR4) synchronous dynamic random-access memory (SDRAM) integrated onto a single semiconductor chip, a low power double data rate type 5 (LPDDR5), double data rate type 4 (DDR4), double data rate type 5 (DDR5), a high bandwidth memory (HBM) device, or other electronic device that may utilize temporary shorts to external power to compensate for current drop in the semiconductor device 10. The semiconductor device 10 may be mounted on an external substrate 2, such as a memory module substrate, a motherboard, and the like. The semiconductor device 10 may include any number of memory banks each having a number of memory cell arrays 11. Each memory cell array 11 may include any number of word lines WL, any number of bit lines BL, and any number of memory cells MC arranged at intersections of the word lines WL and the bit lines BL. The selection of the word line WL is performed by a row decoder 12 and the selection of the bit line BL is performed by a column decoder 13. Sense amplifiers (SAMP) 18 are coupled to corresponding bit lines BL and connected to local input/output (I/O) line pairs LIOT/B. Local IO line pairs LIOT/B are connected to main IO line pairs MIOT/B via transfer gates (TG) 19, which function as switches to control signal flow.

The semiconductor device 10 may also include any number of external terminals, which may communicate with other electrical components/devices. The external terminals may, in turn, include address terminals 21, command terminals 22, data terminals 24, and power supply terminals 25, 26. In particular, the address terminals 21 receive an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12 as well as a decoded column address signal YADD to the column decoder 13. The address decoder 32 also receives the bank address signal BADD and supplies the bank address signal BADD to the row decoder 12 and the column decoder 13.

The command terminals 22 receive a command signal COM. The command signal COM may include one or more separate signals. The command terminals 22 transfer the command signal COM to a command decoder 34 via the command input circuit 33. The command decoder 34 decodes the command signal COM to generate various internal command signals. For example, the internal commands may include a row command signal to select a word line WL and a column command signal, such as a read command or a write command, to select a bit line BL. Additionally, the data terminals 24 may be coupled to output buffers for read operations of memories or to input buffers for read/write access of the memories.

Although the address terminals 21 and the command terminals 22 are illustrated as separate terminals, it should be appreciated that in some embodiments, the address input circuit 31 and the command input circuit 33 may receive address signals ADD and command signals COM via the same terminal. For instance, the address and command terminals may provide an address signal at a falling clock edge (e.g., in synchronism with clock falling edge) and a command signal at a rising clock edge (e.g., in synchronism with clock rising edge). Further, the data terminals 24 may also be a single terminal that alternatively receives data signals (DQ, DQS, DM).

Accordingly, the address signals ADD, BADD and the command signals COM may be used to access a memory cell MC in the memory cell array 11. As an example, when a command signal COM indicating a read operation is timely supplied to a word line WL and a bit line BL designated by a respective row address and column address of the address signal ADD, data may be read from the memory cell MC associated with the row address and column address. The read data DQ may be output externally from the data terminals 24 via a read/write amplifier 15 and an input/output circuit 17. Similarly, when a command signal COM indicating a write operation is timely supplied to a word line WL and a bit line BL designated by a respective row address and column address of the address signal ADD, data DQ may be written to the memory cell MC associated with the row address and column address. The write data DQ may be supplied to the memory cell MC after being received from the data terminals 24, the input/output circuit 17, and the read/write amplifier 15.

In some embodiments, the input/output circuit 17 may include input buffers that store data for processing and/or transmission. Further, the input/output circuit 17 receives a timing signal from an external clock that controls input timing of read data DQ and output timing of write data DQ. The input/output circuit 17 may be powered using dedicated power supply potentials VDDQ and VSSQ, such that power supply noise generated by the input/output circuit 17 does not propagate to the other circuit blocks. The power supply potentials VDDQ and VSSQ may be of the same potentials as power supply potentials VDD and VSS that are supplied to power supply terminals 25, respectively.

In particular, the power supply potentials VDD (e.g., VPERI) 25 and VSS 25 may be supplied to a bandgap circuit 40. In some embodiments, the bandgap circuit 40 may output a constant (e.g., fixed) voltage ($V_{bgr}$) independent of process variations (e.g., circuit loading), power supply variations, temperature changes, and the like. In other words, the $V_{bgr}$ voltage may be independent of PVT condition variations. The bandgap circuit 40 may generate various internal potentials VPP, VOD, VARY that are provided to circuit elements of the semiconductor device 10. For example, the internal potential VPP may be mainly used in the row decoder 12 and the reference current circuitry 38 and the internal potentials VOD and VARY may be mainly used in the sense amplifiers 18 included in the memory cell array 11.

The power supply potentials VDD (e.g., VPERI) 25 may also be supplied to a tracking and pulse generation circuit 42 that facilitates control of pullup transistors within the semiconductor device 10. For example, the semiconductor device 10 may include multiple power amplifiers that in turn include transistors, such as PMOS transistors. The PMOS transistors may generate pullup current when the semiconductor device 10 is in a high current demand mode above some threshold. If the PMOS transistors are left on for too long, the pullup current may overshoot a target current and may charge (e.g., vary the voltage) portions of the circuitry of the semiconductor device 10, reducing performance of the semiconductor device 10 and/or lifespan of the circuit components. As such, the tracking and pulse generation circuit 42 may mimic the pullup current and generate a pulse to control operation of any number of pullup transistors.

Figure 2:
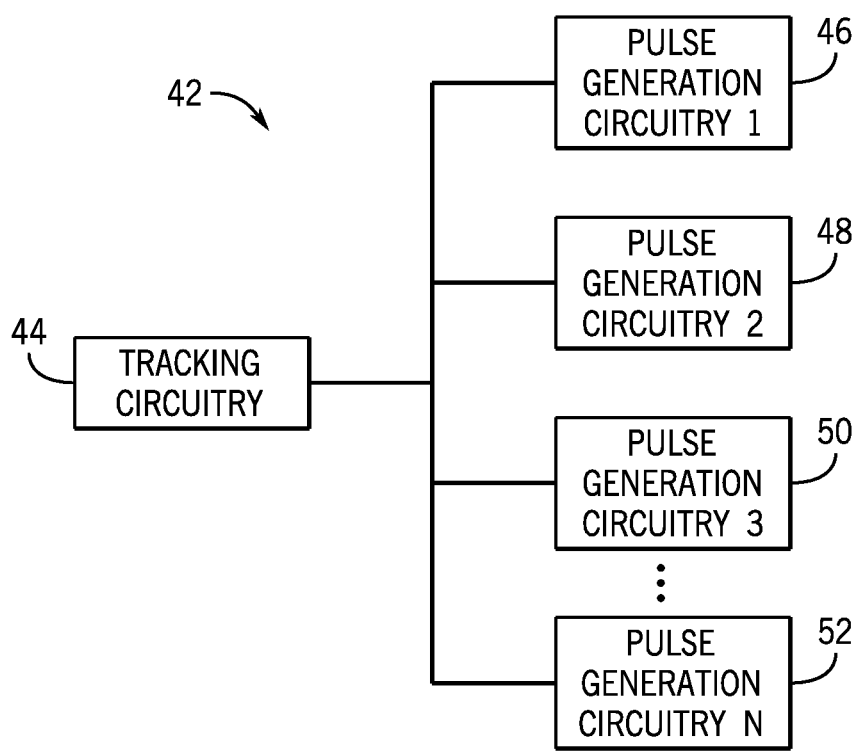
FIG. 2 is a schematic diagram of the tracking and pulse generation circuit that includes tracking circuitry and pulse generation circuitry, in accordance with an embodiment of the present disclosure.

FIG. 2 illustrates a block diagram of the tracking and pulse generation circuit 42 including tracking circuitry 44 that may track pullup current for power amplifiers. As described in further detail below, the tracking circuitry 44 may include any number of operational amplifiers and any number of transistors, such as PMOS transistors. The PMOS transistors may have a similar configuration as the PMOS transistors in the pullup circuitry. As such, the PMOS transistors may mimic the current generated and may track the PVT status of a corresponding PMOS transistor. In certain embodiments, the tracking circuitry 44 may operate any number of pulse generation circuitries (e.g., 4, 6, 8, 12, and so forth). For example, a single semiconductor chip may include a single tracking circuitry 44 and/or each memory bank may include a corresponding pulse generation circuitry. As described further below, the pulse generation circuitry 46, 48, 50, 52 may include any number of comparators and any number of transistors, such as PMOS transistors and/or NMOS transistors. Each pulse generation circuitry 46, 48, 50, 52 may generate a pulse with a time period and the pulse may control operation of a corresponding short to external power.

Figure 3:
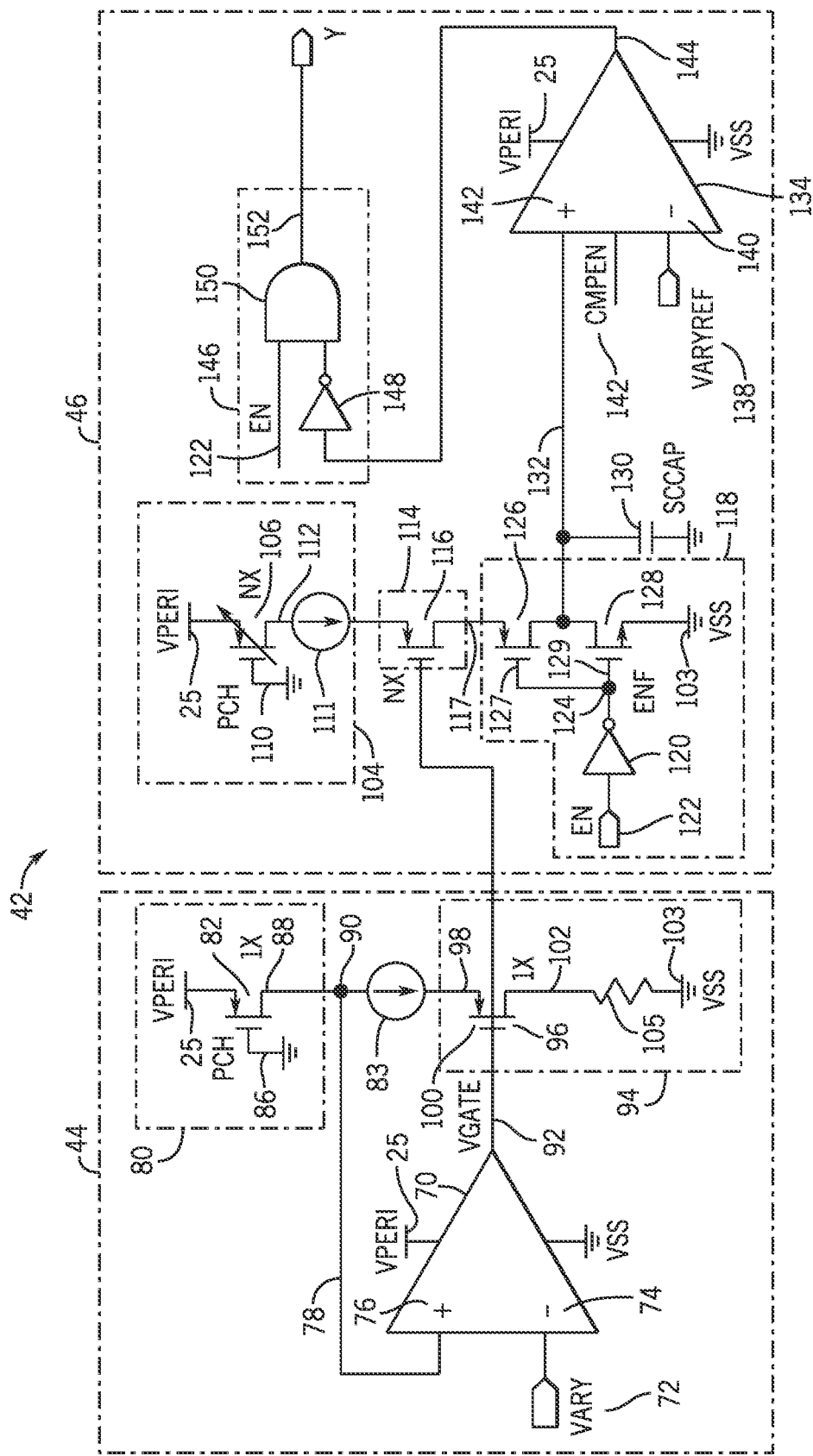
FIG. 3 is another schematic diagram of the tracking circuitry and pulse generation circuitry, in accordance with an embodiment of the present disclosure.

FIG. 3 illustrates a schematic diagram of tracking and pulse generation circuit 42 that may facilitate tracking the pullup operation and pulse generation across variations in PVT conditions, in accordance with an embodiment of the present disclosure. The tracking and pulse generation circuit 42 may include tracking circuitry 44, including an operational amplifier 70 that is driven (e.g., powered) using the power supply potential VPERI (e.g., VDD) 25 generated external to the semiconductor device 10. Using VPERI 25 to drive the amplifier 70 as opposed to using an internally generated power supply potential, such as VPP, may enhance power savings as VPERI 25 is generally of a lower voltage level than the internally generated power supply potentials.

The amplifier 70 may receive an array voltage ($V_{ary}$) 72 at, for example, a negative input terminal 74 of the amplifier 70. The $V_{ary}$ 72 may be at a same voltage level (e.g., 1.0-1.3 volts) as the voltage of a power line bus ($V_{ary}$ Bus) used to transmit power generated by the power amplifier to other components within the semiconductor device 10. In some embodiments, the $V_{ary}$ 72 may be received at a positive input terminal 76 of the amplifier 70. Further, the amplifier 70 may also receive a feedback voltage ($V_{fb}$) 78 at the remaining input terminal, which in the illustrated embodiment, is the positive input terminal 76 of the amplifier 70. The positive input terminal 76 may be coupled to pullup current tracking circuitry 80 that has a current 83 that tracks/mimics the current generated by the short regardless of PVT variations. For example, the pullup current tracking circuitry 80 includes a PMOS transistor 82.

As such, by having the current 83 track/mimic the current generated by the short, the pullup current tracking circuitry 80 may track the PVT status of the PMOS transistor 82. The pullup current tracking circuitry 80, in particular, may include the PMOS transistor 82 with a source terminal tied to the voltage supply (e.g., VPERI 25) and a gate terminal 86 tied to 0 volts (e.g., VSS, ground) in a similar configuration as PMOS transistors used to perform the short. Further, the current may flow at a drain terminal 88 of the PMOS transistor 82 and may adjust according to the PVT status of the PMOS transistor 82.

Because of the amplifier structure and the current 83 generated by the pullup current tracking circuitry 80, a node 90 coupling the pullup current tracking circuitry 80 and the positive input terminal 76 may have a potential that is the same as that of the power line bus voltage (e.g., Vary=$V_{ary}$ Bus). That is, the feedback voltage ($V_{fb}$) 78 may be the power line bus voltage ($V_{ary}$ Bus). Further, because the amplifier 70 is part of a voltage follower structure, an output (e.g., Vgate) 92 of the amplifier 70 may be at an equivalent (e.g., follow) voltage level as the $V_{ary}$ 72 input to the amplifier 70. That is, the output 92 and the negative input terminal 74 may be at a potential equivalent of $V_{ary}$ 72. In some embodiments, the $V_{ary}$ 72 and the output 92 may be 1.0 volts to 1.3 volts. In addition, because the amplifier 70 is a voltage follower amplifier, the amplifier 70 may act as a buffer between the pullup current tracking circuitry 80 and electrical loads, thereby avoiding loading of the pullup current tracking circuitry 80.

The output 92 may be coupled to a second stage PMOS unit 94. The PMOS unit 94 may include a PMOS transistor 96 with a source terminal 98 tied to the node 90, a gate terminal 100 tied to the output 92, and a drain terminal 102 tied to power supply potential 103 (e.g., VSS, ground) via a resistor 105.

The tracking and pulse generation circuit 42 may also include pulse generation circuitry 46, including pullup current generator circuitry 104 that may be configured similar to the pullup current tracking circuitry 80 and may mirror/mimic the current 83. In particular, the pullup current generator circuitry 104 may include the PMOS transistor 106 with a source terminal tied to the voltage source VPERI 25 and a gate terminal 110 tied to ground (e.g., 0 volts) in a similar configuration as the PMOS transistor 82. Further, a current 111 may flow at a drain terminal 112 of the PMOS transistor 106 and may adjust according to the PVT status of the PMOS transistor 106. In certain embodiments, the current 111 flowing from the drain terminal 112 of the PMOS transistor 106 may be proportional to the current 83 flowing from the drain terminal 88 of the PMOS transistor 82. This proportion may be set by the proportion of the size of the PMOS transistor 106 to the PMOS transistor 82 and the PMOS transistor 96 to a PMOS transistor 116 of a PMOS unit 114. This proportionality may be maintained due to the current mirror-like configuration of the PMOS transistors 96 and 114. Specifically, the output 92 may be further coupled to the PMOS unit 114. In particular, the PMOS unit 114 may include the PMOS transistor 116 with a gate terminal coupled to the output 92, a source terminal coupled to the drain terminal 112 of the PMOS transistor 106, and a drain terminal coupled to the comparator switch circuitry 118. Due to the configuration of the terminals of the PMOS transistor 916, a current mirror may form between the mirroring PMOS transistors 96 and the PMOS transistor 116.

The size of the PMOS transistor 106 and/or PMOS transistor 116 may be selected based on a desired time period for a pulse that controls operation and prevents current overshoot. In some embodiments, the desired time period may be about 1-12 nanoseconds (e.g., 2-9 nanoseconds, 3-7 nanoseconds, 2-5 nanoseconds, and so forth). For example, for fast corner scenarios the desired time period may be between 1-3 nanoseconds and for slow corner scenarios the desired time period may be between 8-12 nanoseconds.

A comparator switch circuitry 118 may control flow of the current 111 from the drain terminal 117 of the PMOS transistor 116 to charge a capacitor 130 by setting a voltage 132 that may be input to a comparator 134. The comparator switch circuitry 118 may include an inverter 120 that may receive and may invert an enable signal 122 (e.g., En). A node 124 at the output of the inverter 120 may be coupled to the gate terminal 127 of a PMOS transistor 126 and the gate terminal 129 of an NMOS transistor 128. When the enable signal 122 is 1, the inverter 120 may output a 0 at node 124. As such, the PMOS transistor 126 may be turned on and current from the PMOS unit 114 may flow to and charge the capacitor 130 and the voltage 132 may increase towards the same voltage level (e.g., 1.0-1.3 volts) as the voltage $V_{ary}$. When the enable signal 122 is 0, the inverter 120 may output a 1 at node 124. As such, the PMOS transistor 126 may be turned off and current from the PMOS unit 114 may be stopped from flowing to the capacitor 130 and the voltage 132 may decrease to 0. Accordingly, the NMOS transistor 128 may be turned on and the capacitor 130 and charge on the line for voltage 132 may be discharged to ground. In certain embodiments, a size of the capacitor 130 may be selected based on the desired time period (e.g., about 1-12 nanoseconds) for the pulse.

The comparator 134 may receive the voltage 132 as an input at, for example, a positive input terminal 136 of the comparator 134. Further, the comparator 134 may also receive an array reference voltage (VaryRef) 138 at the remaining input terminal, which in this case, is the negative input terminal 140 of the comparator 134. The array reference voltage 138 may be less than (e.g., 0.5-0.7 volts) the array voltage 72 to account for threshold voltages for various components. A comparator enable signal 142 controls operation of the comparator 134. The comparator 134 outputs a signal 144 based on a comparison between the voltage 132 at the positive input terminal 136 and the array reference voltage 138 at the negative input terminal 140. For example, when the array reference voltage 138 is greater than the voltage 132, the comparator 134 outputs a 0 as the signal 144. As the voltage 132 increases towards the same voltage level (e.g., 1.0-1.3 volts) as the array voltage 72, the voltage 132 eventually exceeds the array reference voltage 138 after a time period. As such, the comparator 134 outputs a 1 as the signal 144.

The signal 144 may be transmitted from the comparator 134 to a local pulse generator circuitry 146. In particular, the local pulse generator circuitry 146 may include an inverter 148 and an AND gate 150. The signal 144 from the comparator 134 may be received at an input of the inverter 148. For example, the signal 144 may be a 0 as the voltage 132 is less than the array reference voltage 138. The inverter 148 may invert the signal 144 to a 1 and provide the inverted signal as a first input to the AND gate 150. The AND gate 150 may receive the enable signal 122 at a second input. The enable signal 122 may be a 1 to supply the voltage 132 to the comparator 134. Accordingly, both inputs to the AND gate 150 may be high for a time period when the voltage 132 is less than the array reference voltage 138. As such, the AND gate 150 may output a pulse generator signal 152 that is high for a time period starting when the enable signal 122 goes high and ending when the voltage 132 exceeds the array reference voltage 138. After the voltage 132 exceeds the array reference voltage 138, the comparator 134 may output the signal 144 as a 1. As such, the inverter 148 may output a low signal (e.g., 0) to the first input of the AND gate 150. Accordingly, the AND gate 150 may output the pulse generator signal 152 as a low value (e.g., 0). In certain embodiments, to save power, a falling edge of the pulse generator signal 152 may be received by the comparator 134 as the comparator enable signal 142 or may be used to set values for the comparator enable signal 142. As such, after the local pulse generator circuitry 146 outputs a pulse corresponding to the time period, the comparator 134 may be switched off by the falling edge of the pulse generator signal 152 preventing power consumption by the comparator 134 until the comparator enable signal 142 is reset to high.

Figure 4:
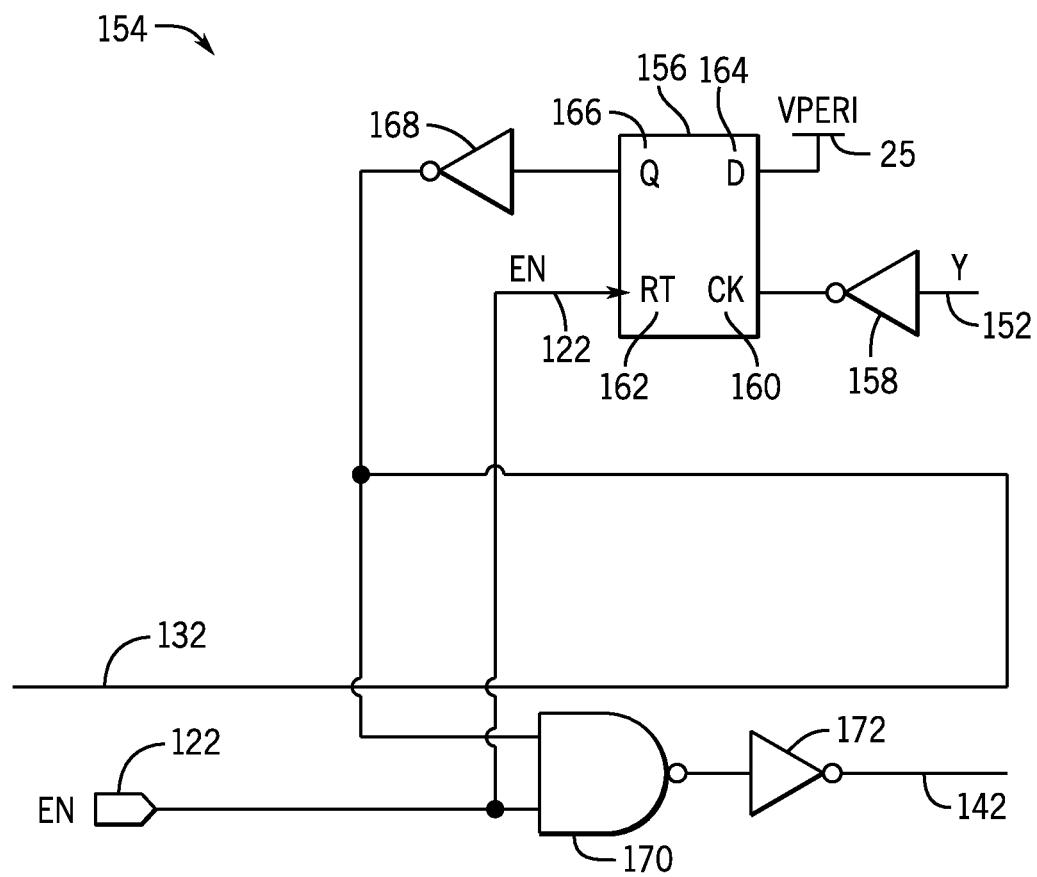
FIG. 4 is a schematic diagram of comparator control circuitry for an embodiment of the tracking and pulse generation circuit, in accordance with an embodiment of the present disclosure.

As described above, the pulse generator signal 152 may be used to control the comparator enable signal 142 and control operation of the comparator 134. FIG. 4 illustrates comparator control circuitry 154 that may control operation of a comparator, such as comparator 134 in FIG. 3, in accordance with an embodiment. In particular, the comparator control circuitry 154 may be a portion of the pulse generation circuitry 46, such as comparator switch circuitry 118 in FIG. 3, and may include a flip flop 156. As described above, the pulse generator signal 152 may have a falling edge after the voltage 132 exceeds the array reference voltage 138. As such, an inverter 158 may receive the falling edge and output a rising edge to the clock input 160 of the flip flop 156. A data input 164 of the flip flop 156 may receive the VPERI (e.g., VDD) 25 generated external to the semiconductor device 10. As such, the data input 164 may latch in VPERI on the rising edge. Accordingly, an output 166 of the flip flop 156 may go high when the rising edge is provided to the clock input 160.

The output 166 of the flip flop 156 may be coupled to an inverter 168. The inverter 168 may invert the high signal from the output 166 to a low signal and the output of the inverter 168 may be coupled to a first input of the NAND gate 170. The enable signal 122 may be provided to a second input of the NAND gate 170. The output of the NAND gate 170 is coupled to an input of an inverter 172. The inverter 172 inverts the output of the NAND gate 170 and provides the output as the compensator enable signal 142. As such, the NAND gate 170 and inverter 172 correspond to an AND gate. For example, unless both inputs to the NAND gate 170 are high, the output (e.g., comparator enable signal 142) of the inverter 172 is low.

The enable signal 122 may also be provided to a reset input 162 of the flip flop 156. Whenever the enable signal is ON, the flip flop 156 may be reset and the output 166 may go low. The output 166 is then inverted by the inverter 168 to a high signal and provided to the first input of the NAND gate 170. As both the inputs to the NAND gate 170 are now high, the output of the NAND gate 170 is low. The inverter 172 receives the low signal as an input and inverts to a high signal corresponding to the comparator enable signal 142. Accordingly, the comparator control circuitry 154 may control the operation of the comparator based on the pulse generator signal 152 by providing the comparator enable signal 142. In other words, the comparator control circuitry 154 may be used to turn off the comparator 134 after the pulse generator signal 152 has had a falling edge without waiting for the enable signal 122 to transition low. By reducing the time after the pulse, the power consumed using the comparator 134 may be reduced.

Figure 5:
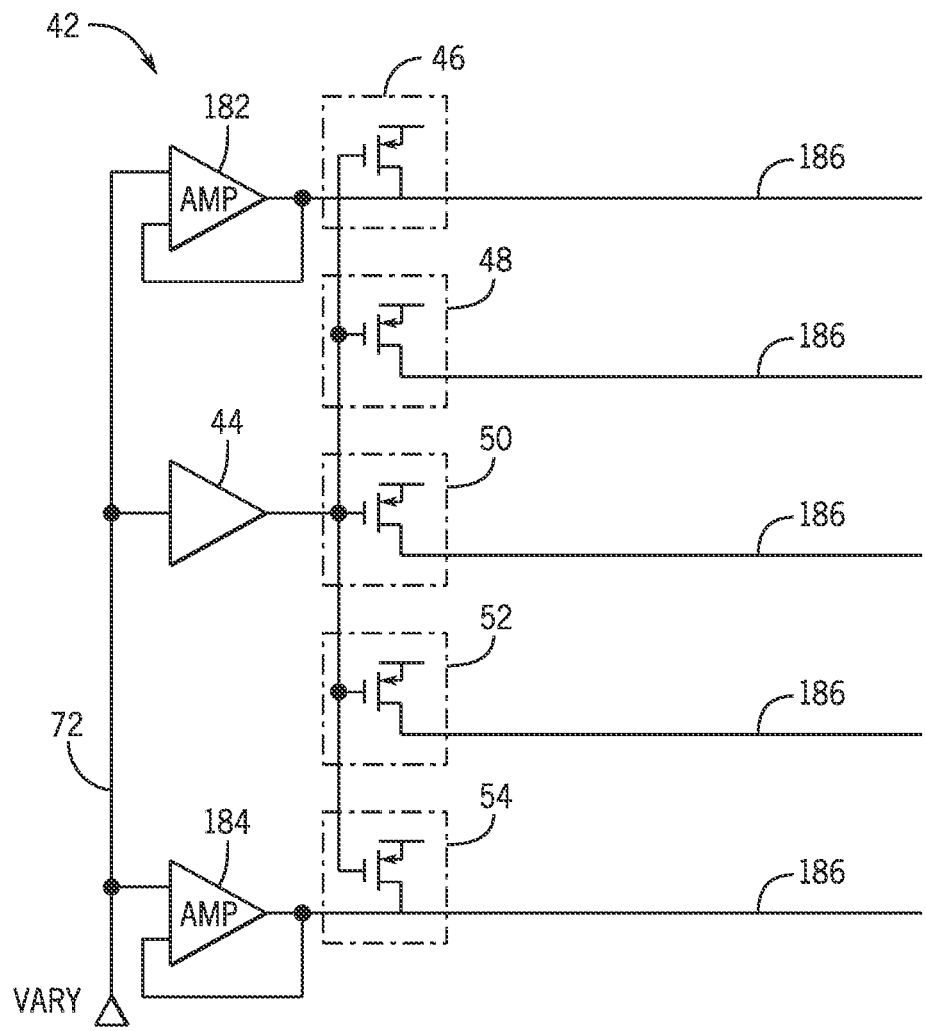
FIG. 5 is a schematic diagram of power amplifiers of the semiconductor device, in accordance with an embodiment of the present disclosure.

FIG. 5 illustrates a number of power amplifiers, such as power amplifiers 182, 184, coupled to the power line bus 186 (e.g., Vary Bus). The power amplifiers 182, 184 may provide array voltage 72 (Vary) and may generate an amplified output to drive circuitry and components within the semiconductor device 10. As described above, the tracking circuitry 44 may track the pullup current associated with a transistor of a power amplifier. While only a single tracking circuitry 44 is shown in FIG. 5, the tracking and pulse generation circuit 42 may include any number of tracking circuitries 44 and each tracking circuitry 44 may be coupled to any number of pulse generation circuitries. The tracking circuitry 44 may be coupled to one or more pulse generation circuitries 46, 48, 50, 52, 54. Each of the pulse generation circuitries 46, 48, 50, 52, 54 may generate a pulse and the pulse may control operation of a corresponding short to external power. For example, a time period of the pulse may be controlled to disconnect the short to external power and prevent current overshoot. While five pulse generation circuits are shown, the tracking and pulse generation circuit 42 may include any number of pulse generation circuitries 46.

Embodiments of the present disclosure relate to tracking pullup current and controlling operation of power amplifiers regardless of variations in PVT conditions. The tracking and pulse generation circuit 42 may enable automatic tracking of the pullup current generated by the power amplifiers across PVT conditions, allowing for appropriate control of the power amplifiers without overshooting a target current.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
   one or more power amplifiers configured to power components of the apparatus; and
   a tracking and pulse generation circuit, comprising:
      tracking circuitry, comprising:
         an amplifier,
         pullup current tracking circuitry coupled to an input terminal of the amplifier, wherein the pullup current tracking circuitry is configured to generate a first current that tracks a pullup current generated by the one or more power amplifiers; and
      pulse generation circuitry, comprising:
         pullup current generator circuitry coupled to an output of the amplifier, wherein the pullup current generator circuitry is configured to generate a second current that mirrors the first current; and
         pulse generator circuitry coupled to the pullup current generator circuitry, wherein the pulse generator circuitry is configured to generate a pulse to control operation of the one or more power amplifiers based at least in part on the second current.

2. The apparatus of claim 1, wherein the one or more power amplifiers comprises a transistor.

3. The apparatus of claim 2, wherein the pullup current generated by the one or more power amplifiers comprises current flowing through the transistor of the one or more power amplifiers and wherein the pullup current varies according to process, voltage, and temperature (PVT) conditions of the transistor.

4. The apparatus of claim 1, wherein the amplifier is a voltage follower configured to:
   receive a power line bus voltage at another input terminal of the amplifier; and
   force the output to a voltage level based at least in part on the power line bus voltage.

5. The apparatus of claim 1, wherein the pullup current tracking circuitry comprises a P-channel metal-oxide-semiconductor (PMOS) transistor, wherein a gate terminal of the PMOS transistor is coupled to ground, wherein a source terminal of the PMOS transistor is coupled to a voltage supply, wherein a drain terminal of the PMOS transistor is coupled to the input terminal of the amplifier, and wherein the pullup current tracking circuitry is configured to track variations in the pullup current based on process, voltage, and temperature (PVT) conditions of a transistor of the one or more power amplifiers.

6. The apparatus of claim 5, wherein the PMOS transistor is configured to receive the first current, at a source terminal of the PMOS transistor, generated by the one or more power amplifiers.

7. The apparatus of claim 5, wherein the pullup current generator circuitry comprises:
   a second PMOS transistor, wherein a gate terminal of the second PMOS transistor is coupled to ground, wherein a source terminal of the second PMOS transistor is coupled to the voltage supply.

8. The apparatus of claim 7, comprising a third PMOS transistor having a source terminal coupled to a drain terminal of the second PMOS transistor, wherein a gate terminal of the third PMOS transistor is coupled to the output of the amplifier, and wherein a drain terminal of the third PMOS transistor is coupled to a comparator.

9. Circuitry for tracking a pullup current, comprising:
   pullup current tracking circuitry configured to generate a first current that tracks a pullup current of a transistor of a power amplifier and configured to track variations in the pullup current based on process, voltage, and temperature (PVT) conditions of the transistor;
   pullup current generator circuitry configured to generate a second current that mirrors the first current; and
   local pulse generator circuitry coupled to the pullup current generator circuitry, wherein the local pulse generator circuitry is configured to generate a pulse to control operation of the power amplifier based at least in part on the second current.

10. The circuitry of claim 9, comprising a second pullup current generator circuitry coupled to the pullup current tracking circuitry, wherein the second pullup current generator circuitry is configured to generate a third current that mirrors the first current.

11. The circuitry of claim 10, comprising a second local pulse generator circuitry coupled to the second pullup current generator circuitry, wherein the second local pulse generator circuitry is configured to generate a second pulse to control operation of a second power amplifier based at least in part on the third current.

12. The circuitry of claim 9, comprising:
   a comparator;
   an inverter, wherein an input of the inverter is configured to receive and invert an enable signal; and
   a PMOS transistor, wherein a gate terminal of the PMOS transistor is coupled to an output of the inverter, wherein a source terminal of the PMOS transistor is coupled to a drain terminal of a second PMOS transistor, and wherein a drain terminal of the PMOS transistor is coupled to an input of the comparator.

13. The circuitry of claim 12, comprising an N-channel metal-oxide-semiconductor (NMOS) transistor, wherein a gate terminal of the NMOS transistor is coupled to the output of the inverter, wherein a source terminal of the NMOS transistor is coupled to the drain terminal of the PMOS transistor, and wherein a drain terminal of the NMOS transistor is coupled to ground.

14. The circuitry of claim 12, comprising a capacitor coupled between the drain terminal of the PMOS transistor and ground.

15. A tracking and pulse generation circuit, comprising:
tracking circuitry comprising:
pullup current tracking circuitry, wherein the pullup current tracking circuitry is configured to generate a first current that tracks a pullup current generated by one or more power amplifiers;
a plurality of pulse generation circuitries, each pulse generation circuitry comprising:
pullup current generator circuitry coupled to the pullup current tracking circuitry, wherein the pullup current generator circuitry is configured to generate a corresponding second current that mirrors the first current; and
pulse generator circuitry coupled to the pullup current generator circuitry, wherein the pulse generator circuitry is configured to generate a corresponding pulse to control operation of a corresponding power amplifier of the one or more power amplifiers based at least in part on the corresponding second current.

16. The tracking and pulse generation circuit of claim 15, wherein each pulse generation circuitry of the plurality of pulse generation circuitries comprises comparator switch circuitry coupled to the pulse generator circuitry, wherein the comparator switch circuitry is configured to control a time period of the corresponding pulse.

17. The tracking and pulse generation circuit of claim 15, wherein each pulse generation circuitry of the plurality of pulse generation circuitries comprises a comparator, wherein the comparator is configured to:
receive an array reference voltage at an input terminal of the comparator;
compare the array reference voltage with a voltage provided by a PMOS transistor; and
generate an output based on the comparison.

18. The tracking and pulse generation circuit of claim 17, wherein:
the output is high when the voltage provided by the PMOS transistor exceeds the array reference voltage; and
the output is low when the voltage provided by the PMOS transistor falls below the array reference voltage.

19. The tracking and pulse generation circuit of claim 17, wherein the pulse generator circuitry comprises:
an inverter coupled to the output of the comparator, and
an AND gate, the AND gate configured to receive an enable signal at a first input and configured to receive an output of the inverter at a second input and to output the corresponding pulse.

20. The tracking and pulse generation circuit of claim 19, comprising a flip flop, the flip flop configured to:
receive the corresponding pulse at a clock input of the flip flop; and
receive the enable signal at a reset input of the flip flop.

* * * * *